(12) United States Patent
Flachowksy et al.

(10) Patent No.: US 9,917,087 B2
(45) Date of Patent: Mar. 13, 2018

(54) INTEGRATED CIRCUITS WITH A PARTIALLY-DEPLETED REGION FORMED OVER A BULK SILICON SUBSTRATE AND METHODS FOR FABRICATING THE SAME

(71) Applicant: GLOBALFOUNDRIES, Inc., Grand Cayman (KY)

(72) Inventors: Stefan Flachowksy, Dresden (DE); Juergen Faul, Radebeul (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/961,554

(22) Filed: Aug. 7, 2013

(65) Prior Publication Data
US 2015/0041910 A1   Feb. 12, 2015

(51) Int. Cl.
*H01L 21/8238* (2006.01)
*H01L 27/092* (2006.01)

(52) U.S. Cl.
CPC .... *H01L 27/092* (2013.01); *H01L 21/823807* (2013.01)

(58) Field of Classification Search
CPC .............. H01L 27/092; H01L 21/823807
USPC ........................................................ 438/199
See application file for complete search history.

(56) References Cited

U.S. PATENT DOCUMENTS

| 6,855,984 B1* | 2/2005 | Wu et al. ............... 257/335 |
| 2002/0074612 A1* | 6/2002 | Bulucea ........... H01L 21/26586 257/402 |
| 2006/0030092 A1* | 2/2006 | Ito et al. ................ 438/197 |
| 2007/0122954 A1* | 5/2007 | Liu et al. ................ 438/187 |
| 2008/0179686 A1* | 7/2008 | Chen ............. H01L 21/82389 257/369 |
| 2009/0085129 A1* | 4/2009 | Majhi et al. ............. 257/402 |
| 2009/0152626 A1* | 6/2009 | Venugopal et al. ..... 257/338 |
| 2009/0174002 A1* | 7/2009 | Ouyang ........ H01L 21/823807 257/369 |

(Continued)

OTHER PUBLICATIONS

Perron, L., "Dynamic Floating Body Effects in PD SOI MOSFET's Biased in the Kink Region," Dept. of Electronic Eng., Osaka University, Suita, Osaka 565, Japan, pp. 1-4.

*Primary Examiner* — Phat X Cao
*Assistant Examiner* — Mohammad M Hoque
(74) *Attorney, Agent, or Firm* — Lorenz & Kopf, LLP (57) ABSTRACT

Integrated circuits and methods of fabricating integrated circuits are provided. In an exemplary embodiment, an integrated circuit includes a bulk silicon substrate that is lightly-doped with a first dopant type divided into a first device region and a second device region, and a well region that is lightly-doped with a second dopant type formed in the second device region. The integrate circuit further includes heavily-doped source/drain extension regions of the first dopant type aligned to a first gate electrode structure and heavily-doped source/drain extension regions of the second dopant type aligned to a second gate electrode structure, and an intermediately-doped halo region of the second dopant type formed underneath the first gate electrode structure and an intermediately-doped halo regions of the first dopant type underneath the second gate electrode structure. Still further, the integrated circuit includes heavily-doped source/drain regions.

10 Claims, 4 Drawing Sheets

(56) References Cited

U.S. PATENT DOCUMENTS

| | | | |
|---|---|---|---|
| 2012/0156837 A1* | 6/2012 | Scheiper et al. | 438/216 |
| 2012/0161238 A1* | 6/2012 | Scheiper et al. | 257/368 |
| 2012/0184077 A1* | 7/2012 | Bahl | H01L 21/82285 |
| | | | 438/268 |
| 2014/0048888 A1* | 2/2014 | Chen et al. | 257/369 |
| 2014/0197497 A1* | 7/2014 | Ito | H01L 29/7833 |
| | | | 257/408 |

* cited by examiner

INTEGRATED CIRCUITS WITH A PARTIALLY-DEPLETED REGION FORMED OVER A BULK SILICON SUBSTRATE AND METHODS FOR FABRICATING THE SAME

TECHNICAL FIELD

The present disclosure generally relates to integrated circuits and methods for fabricating integrated circuits. More particularly, the present disclosure relates to integrated circuits with a partially-depleted region formed over a bulk silicon substrate and methods for fabricating the same.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain electrodes. Complementary MOS (CMOS) devices include a plurality of N-channel MOS (NMOS) transistors and a plurality of P-channel (PMOS) transistors.

The fabrication of integrated circuits requires a large number of circuit elements, such as MOS transistors and the like, to be formed on a given chip area according to a specified circuit layout. CMOS technology is a commonly used technology for manufacturing complex circuitry due to the superior characteristics in view of operating speed and/or power consumption and/or cost efficiency. During the fabrication of complex integrated circuits using CMOS technology, millions of complementary transistors, i.e., N-channel transistors and P-channel transistors, are formed in and on a substrate including a crystalline semiconductor layer. An MOS transistor, irrespective of whether an N-channel transistor or a P-channel transistor is considered, includes so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes, and in particular the gate length, of field effect transistors has been an important design criterion.

In view of further enhancing performance of transistors, in addition to other advantages, the SOI (semiconductor- or silicon-on-insulator) architecture has continuously been gaining in importance for manufacturing MOS transistors due to their characteristic of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. Depending on the level of charge carriers in the channel region, which in turn is dependent upon the doping of the channel region, SOI transistors are either "partially-depleted" or "fully-depleted."

In partially-depleted SOI transistors, during operation, charges can accumulate in the channel region by virtue of the remaining charge carriers therein and the fact that the channel is dielectrically encapsulated. This is referred to in the art as the "floating body" effect. The accumulated charges affect the current in the drain region of the transistor, resulting in drain current "kink" effect, i.e., an abnormal threshold voltage slope, low drain breakdown voltage, and drain current transient charges. For example, when an SOI MOSFET is operated at a large drain-to-source voltage, channel electrons cause substrate ionization near the drain end of the channel. Holes build up in the body of the device, raising the body potential and thereby raising the threshold voltage. This increases the MOSFET current causing a "kink" in the current vs. voltage (I-V) curves.

Utilization of this kink effect is beneficial in certain CMOS integrated circuit designs. For example, in low-power memory device applications, partially-depleted SOI transistors are often used to read and write from memory arrays. Heretofore, as noted above, the kink effect has only been observed in integrated circuits manufactured over a SOI substrate. However, due to processing restrictions and the increased expense of SOI substrates, it is often desirable to employ bulk silicon substrates. Thus, in the prior art, the selection of a bulk silicon substrate required the integrated circuit designer to forego the use of the "kink" effect, and the low-power benefits attendant therewith.

Accordingly, it is desirable to provide improved bulk silicon substrate integrated circuits and methods for fabricating the same that include partially-depleted transistors, which, in operation, exhibit the above-noted kink effect. Furthermore, it is desirable to provide bulk silicon substrate integrated circuits suitable for use in low-power memory device applications. Still further, other desirable features and characteristics of the present disclosure will become apparent from the subsequent detailed description of the disclosure and the appended claims, taken in conjunction with the accompanying drawings and this background of the disclosure.

BRIEF SUMMARY

Integrated circuits and methods of fabricating integrated circuits formed on bulk silicon substrates are provided in various exemplary embodiments. In accordance with one exemplary embodiment, an integrated circuit includes a bulk silicon substrate that is lightly-doped with a first dopant type, which is divided into a first device region and a second device region, and a well region that is lightly-doped with a second dopant type formed in the second device region. The integrated circuit further includes a first gate electrode structure over the first device region and a second gate electrode structure over the second device region, heavily-doped source/drain extension regions of the first dopant type in the bulk silicon substrate aligned with the first gate electrode structure and heavily-doped source/drain extension regions of the second dopant type in the bulk silicon substrate aligned with the second gate electrode structure, and an intermediately-doped halo region of the second dopant type in the bulk silicon substrate underneath the first gate electrode structure and an intermediately-doped halo region of the first dopant type in the bulk silicon substrate underneath the second gate electrode structure. Still further, the integrated circuit includes heavily-doped source/drain regions of the first dopant type aligned in the bulk silicon substrate overlying a portion of the source/drain extension regions in the first device region and heavily-doped source/drain regions of the second dopant type aligned in the bulk silicon substrate overlying a portion of the source/drain extension regions in the second device region.

In accordance with another embodiment, a method of fabricating an integrated circuit includes providing a bulk silicon substrate that is lightly-doped with a first dopant type, dividing the bulk silicon substrate into a first device region and a second device region, and forming a well region that is lightly-doped with a second dopant type in the second device region. The method further includes forming a first gate electrode structure over the first device region and a second gate electrode structure over the second device region, forming heavily-doped source/drain extension regions of the first dopant type in the bulk silicon substrate aligned with the first gate electrode structure and heavily-doped source/drain extension regions of the second dopant type in the bulk silicon substrate aligned with the second gate electrode structure, and forming an intermediately-doped halo region of the second dopant type in the bulk silicon substrate underneath the first gate electrode structure and an intermediately-doped halo region of the first dopant type in the bulk silicon substrate underneath the second gate electrode structure. Still further, the method includes forming heavily-doped source/drain regions of the first dopant type in the bulk silicon substrate overlying a portion of the source/drain extension regions in the first device region and heavily-doped source/drain regions of the second dopant type in the bulk silicon substrate overlying a portion of the source/drain extension regions in the second device region.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

In the prior art, the utilization of the partially-depleted SOI transistor "kink" effect is not possible on bulk substrates with conventional wells because the well-to-substrate and the well-to-well capacitance is too high, hindering fast charging and discharging of this capacitance and limiting the switching speed of the transistor/circuit. Disclosed herein are integrated circuits and methods for fabricating integrated circuits that implement a "partially-depleted" (PD) device into a bulk substrate-based CMOS-technology fabrication process flow. This process flow enables transistors with higher performance due to the utilization of the kink effect on a relatively inexpensive and technologically-matured bulk technology. Further, this combination of classical bulk silicon substrates and partially-depleted transistors gives integrated circuit designers more flexibility for high-performance and low-power applications on the same circuit.

For the sake of brevity, conventional techniques related to semiconductor device fabrication are not described in detail herein. Moreover, the various tasks and process steps described herein may be incorporated into a more comprehensive procedure or process having additional steps or functionality not described in detail herein. In particular, various steps in the manufacture of semiconductor-based integrated circuits are well-known and so, in the interest of brevity, many conventional steps are only mentioned briefly herein or will be omitted entirely without providing the well-known process details.

The techniques and technologies described herein are utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

FIGS. 1-4 illustrate, in cross section, bulk silicon integrated circuit structures and methods for fabricating bulk silicon integrated circuit structures in accordance with various embodiments of the present disclosure. With specific reference to FIG. 1, in one embodiment, depicted is a cross-sectional view of a partially-formed integrated circuit (IC). The partially-formed IC includes a semiconductor substrate 101. As used herein, the term "semiconductor substrate" is used to encompass semiconductor materials conventionally used in the semiconductor industry from which to make electrical devices. "Semiconductor materials" include bulk monocrystalline silicon materials, such as the relatively pure or impurity-doped monocrystalline silicon materials typically used in the semiconductor industry, as well as bulk polycrystalline silicon materials (hereinafter referred to as "polysilicon"), and silicon admixed with other elements such as germanium, carbon, and the like. In addition, "semiconductor materials" encompass other materials such as relatively pure and impurity-doped germanium, gallium arsenide and other III-V compounds, zinc oxide, glass, and the like.

In one embodiment, the bulk silicon substrate 101 may be a p-type doped substrate. For example, the substrate 101 may be a lightly-doped p-type substrate. The substrate 101 may include doped regions or wells having different dopant concentrations. For example, the device may include heavily doped, intermediately doped, and lightly doped regions. The doped regions may be designated by x$^-$, x and x$^+$, where x indicates the polarity of the doping, such as p-type or n-type, and x$^-$ means lightly doped, x means intermediately doped, and x$^+$ means heavily doped. As used herein, a lightly doped region has a dopant concentration of less than about 5E13/cm$^3$, an intermediately doped region has a dopant concentration of about 5E13 to about 5E15/cm$^3$, and a heavily doped region has a dopant concentration of more than about 5E15/cm$^3$. P-type dopants may include boron (B), aluminum (Al), indium (In) or a combination thereof, while n-type dopants may include phosphorus (P), arsenic (As), antimony (Sb) or a combination thereof.

Isolation regions may be provided for isolating or separating different regions of the substrate 101. In one embodiment, device regions are isolated from other regions or device regions by a device isolation region 105. For example, the device isolation region 105 separates the various p-type and n-type devices of a CMOS from one another. The isolation region 105, for example, is a shallow trench isolation (STI) region. Other types of isolation regions may also be employed. For example, the isolation region may be a deep trench isolation (DTI) region. The isolation region 105, for example, extends to a depth of about 4000 Å. Providing isolation regions that extend to other depths, such as about 0.5 to about 10 μm for DTI regions, may also be used. In one embodiment, the width of the isolation region 105 is about 0.3 μm. Providing isolation regions having different depths and widths may also be used. In the embodiment shown in FIG. 1, the isolation region 105 separates a first device region 102, which in an embodiment is a p-type FET (PFET) region, from a second device region 103, which in an embodiment is an n-type FET (NFET) region. As noted above, at this stage of manufacture, the FETs are only partially-formed.

Figure 1:
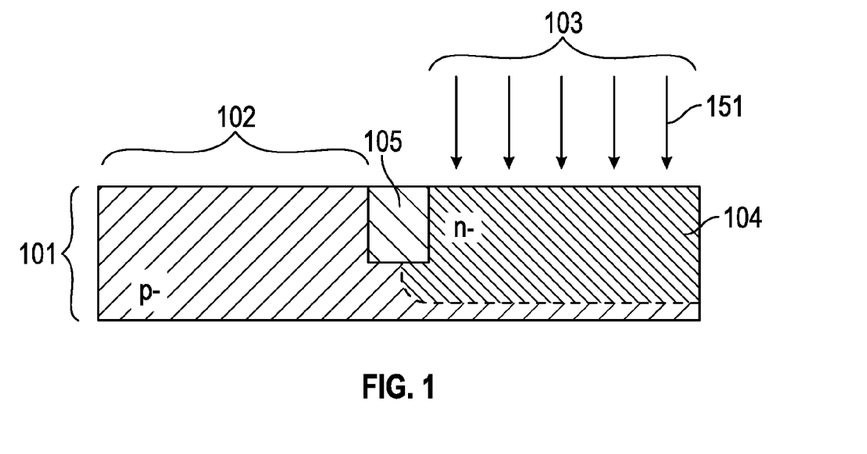
FIGS. 1-4 illustrate, in cross section, bulk silicon integrated circuit structures and methods for fabricating bulk silicon integrated circuit structures in accordance with various embodiments of the present disclosure.

In one embodiment, in the NFET region 103, the substrate 101 includes a doped well 104 disposed in the substrate 101, which encompasses the device region 103. The well is formed by ion implantation of an appropriate ion, as noted by arrows 151 in FIG. 1 The NFET region doped well 104, for example, extends to a depth of about 0.3 μm to about 5 μm, and is doped with a light amount of conductivity-determining ions. The depth and doping, for example, are determined by device breakdown voltage and isolation requirements. Providing a doped well of a different depth may also be used. In one embodiment, the doped well 104 has conductivity-determining ions opposite that of the substrate 101. As shown in FIG. 1, the substrate is a lightly p-type doped substrate, and the NFET region doped well 104 is a lightly n-type doped well.

Figure 2:
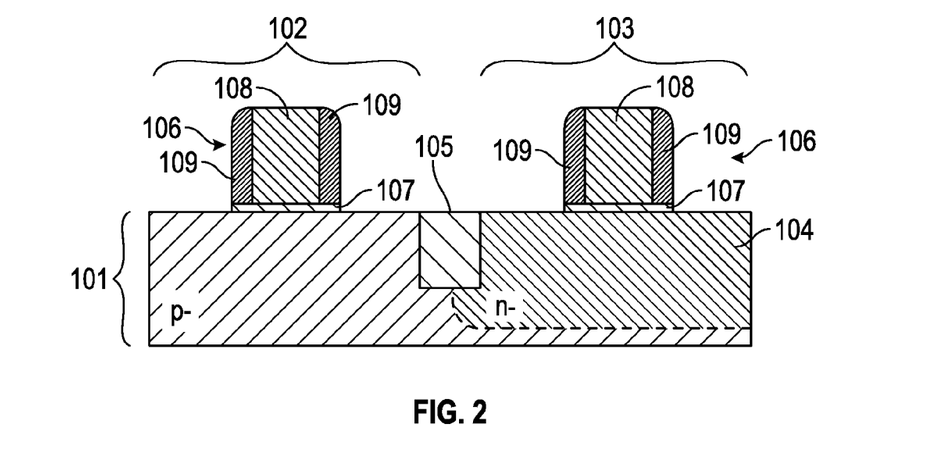

Reference is now made to FIG. 2. As shown therein, each device region 102, 103 includes a gate electrode structure 106. The gate electrode structures 106 may be one of several configurations well known in the art, such as a conventional gate oxide/polysilicon gate electrode (polySiON) configuration, or a high-k dielectric/metal gate electrode (HK/MG) configuration. When a conventional polySiON configuration is used, the gate electrode structures 106 may include a gate insulation layer 107, which may include a conventional gate dielectric material, such as, for example, silicon dioxide, silicon oxynitride, and the like, and a gate electrode 108, which may include polysilicon. On the other hand, when an HK/MG configuration is used, the gate insulation layer 107 may be one of several well-known high-k gate dielectric materials (i.e., materials having a dielectric constant "k" greater than silicon, that is, 3.7), such as tantalum oxide ($Ta_2O_5$), strontium titanium oxide ($SrTiO_3$), hafnium oxide ($HfO_3$), hafnium silicon oxide (HfSiO), zirconium oxide ($ZrO_2$) and the like, whereas the gate electrode 108 may include, for example, metal gate materials such as titanium nitride (TiN), titanium aluminum nitride (TiAlN), titanium silicon nitride (TiSiN) and the like. Furthermore, an upper portion of the metal gate electrode of an HK/MG configuration may also include polysilicon. Other materials and combinations may also be used.

The gate insulator 107 may be a layer of thermally grown silicon dioxide or, alternatively, a deposited insulator such as a silicon oxide, silicon nitride, any kind of high-k oxide such as hafnium oxides, or the like. Deposited insulators may be deposited, for example, by chemical vapor deposition (CVD), atomic layer deposition (ALD), low pressure chemical vapor deposition (LPCVD), or plasma enhanced chemical vapor deposition (PECVD). The gate insulator material preferably has a thickness of about 1 nm to about 10 nm, although the actual thickness may be determined based on the application of the transistor in the circuit being implemented. The material for the gate electrode 108 is formed overlying the gate insulator material. In accordance with certain embodiments, the material used for the gate electrode 108 is polycrystalline silicon, although other replaceable materials could be used instead of polycrystalline silicon. In other embodiments, the material used for the gate electrode 108 includes a thin metal layer underlying polycrystalline silicon. The layer of polycrystalline silicon is preferably deposited, e.g., using LPCVD by the hydrogen reduction of silane. For example, the polycrystalline silicon may have a thickness from about 50 nm to about 100 nm. Thereafter, the polycrystalline silicon, the thin metal layer, and the underlying gate insulator material are etched using hard mask caps as an appropriate etch mask, as is known in the art.

Depending on the device requirements and/or the overall processing strategy, the gate electrode structure 106 may include sidewall spacer structures 109, which may include one or more suitable dielectric materials, such as silicon nitride, silicon dioxide, silicon oxynitride, and the like. Furthermore, the sidewall spacer structures 109 may include two or more spacer elements, such as offset spacers, conformal liners, and the like, which may act as appropriate implantation masks for creating the lateral dopant profile for highly-doped drain and source regions and extension regions, as will be described in greater detail below.

The spacers 109 are fabricated in a conventional manner. In this regard, the spacers 109 may be created by conformally depositing a dielectric material over the semiconductor substrate 101, where the dielectric material is an appropriate insulator, such as silicon nitride. The dielectric spacer material can be deposited in a known manner by, for example, atomic layer deposition (ALD), CVD, LPCVD, semi-atmospheric chemical vapor deposition (SACVD), or PECVD. The layer of dielectric spacer material is deposited to a thickness so that, after anisotropic etching, the spacers 109 formed from the layer have a thickness that is appropriate for any subsequent process steps, such as ion-implantation. In some embodiments, the layer of dielectric spacer material is deposited to a thickness of about 5 nm to about 50 nm. The process continues, in accordance with an exemplary embodiment, with anisotropic etching of the layer of dielectric spacer material to form the spacers 109, as illustrated in FIG. 2. The layer of dielectric spacer material can be etched by, for example, reactive ion etching (RIE) using a suitable etching chemistry. The spacers 109 are used to protect the underlying semiconductor substrate 101 during ion implantation associated with the formation of source/drain extension implants, halo implants, and deep source/drain implants, as will be discussed in greater detail below.

Figure 3A:
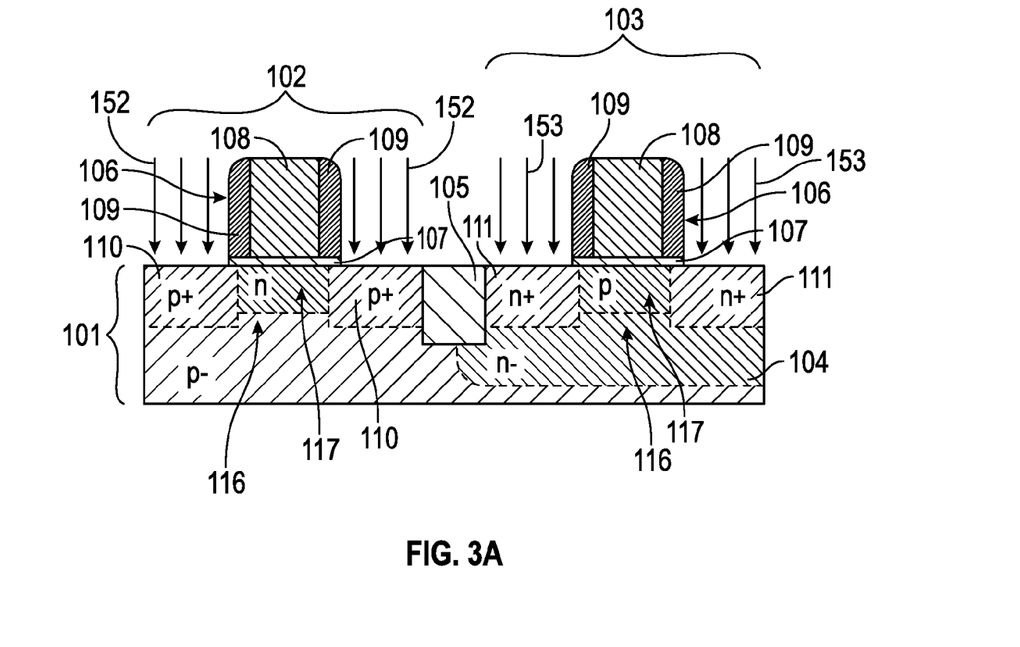
Figure 3B:
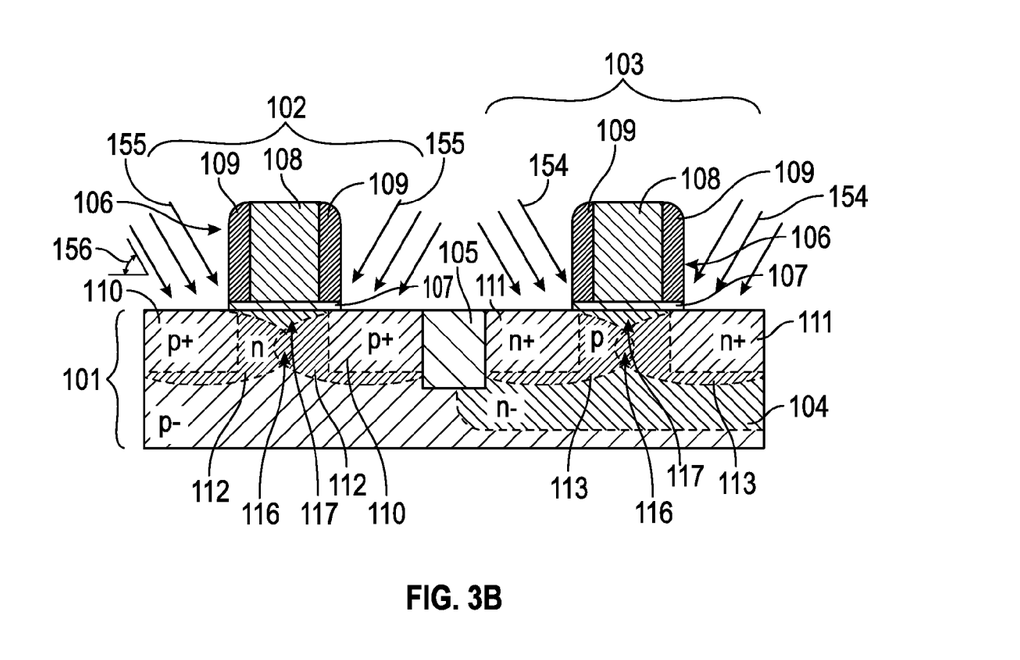
Figure 4:
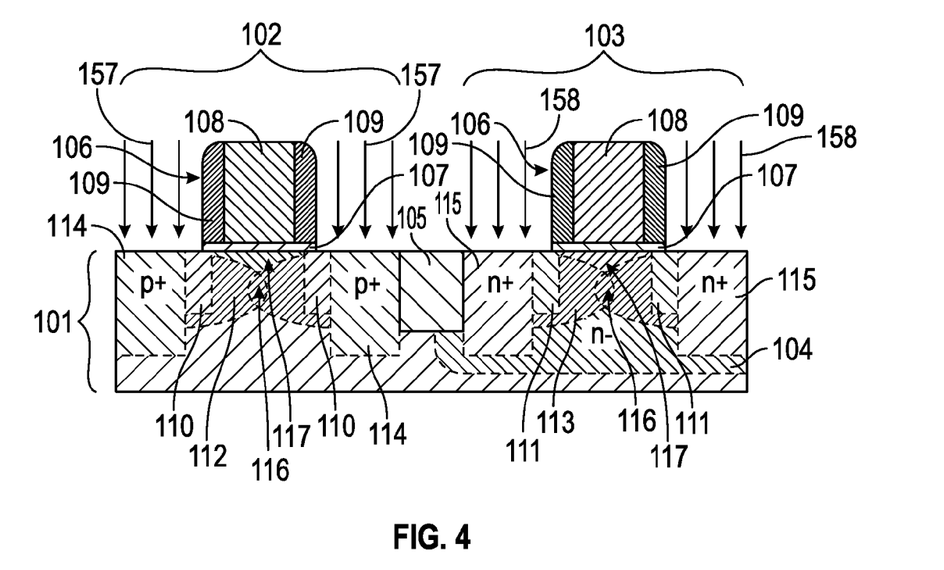

With reference now to FIGS. 3A, 3B, and 4, the integrated circuit may be formed to include, for each device region 102, 103, respectively, source/drain extension regions 110, 111 (implanted as shown in FIG. 3A), halo regions 112, 113 (implanted as shown in FIG. 3B), and source/drain regions 114, 115 (implanted as shown in FIG. 4). It will be appreciated by those skilled in the art that the formation of the source/drain extension regions 110, 111, the halo regions 112, 113, and/or the source/drain regions 114, 115 may be coordinated with the formation of the spacer(s) 109, as noted above, thereby permitting a self-aligned process.

As is well known in the art, the source/drain extension regions 110, 111 may be formed adjacent to a channel region 116. In an embodiment, the source/drain extension regions 110, 111 may be formed to a shallow depth by heavily doping with conductivity-determining ions to facilitate dimensional reductions for the scaling of the integrated circuit. The impurities used to form the source/drain extension regions 110, 111 may include n-type or p-type, depending on the first and second device regions 102, 103 being formed (e.g., n-type impurities for an NMOS device and p-type impurities for a PMOS device). As shown in the exemplary embodiment illustrated in FIG. 3A, the extension regions 110 for the PFET device region 102 are formed by heavily doping p-type ions, as indicated by arrows 152, and the extension regions 111 for the NFET device region 103 are formed by heavily doping n-type ions, as indicated by arrows 153.

The halo regions 112, 113 may be formed adjacent the source/drain extension regions 110, 111. As is known in the art, a halo implant may help to decrease the length of the channel 116, which may be advantageous for minimizing punch-through current and controlling short channel effects, thereby improving the performance of the transistor. For purposes of forming the partially-depleted bulk silicon transistors described herein, the halo implants may form partially-depleted regions 117 in the channels 116 under the gate electrodes 108. These partially-depleted regions 117 allow the transistors to operate with a current profile similar to those known in the art for partially-depleted SOI substrate-based devices, as will be described in greater detail below. In an embodiment, the halo regions 112, 113 may be formed by implanting the substrate 101 with conductivity-determining ions of opposite conductivity type to that of the conductivity-determining ions used to form the source/drain regions 114, 115 and the source/drain extension regions 110, 111. For example, as shown in FIG. 3B, the halo region 112 for the PFET 102 is formed by intermediately doping n-type ions, as indicated by arrows 155, and the halo region 113 for the NFET 103 is formed by intermediately doping p-type ions, as indicated by arrows 154.

The halo dopant material is typically implanted at an angle 156 so that the dopant material may be implanted underneath the spacers 109 and/or the gate electrodes 108. In an embodiment, the angle of the implantation 156 is typically substantially less than ninety degrees relative to the surface of the substrate 101, e.g., between about fifteen to about seventy-five degrees relative to the surface of the substrate 101. In some embodiments, the substrate 101 may be rotated (e.g., dual and quad halo implants) during the angled halo implantation to provide symmetrical forms of the halo regions 112, 113. However, in other embodiments, the halo dopant implant may be implanted perpendicular to the surface of the substrate 101.

It is to be understood that the order in which the source/drain extension regions 110, 111 and the halo regions 112, 113 are formed is not critical, rather, the process parameters (e.g., dose and energy) used to form the source/drain extension regions 110, 111 and the halo regions 112, 113 may be regulated to produce the desired conductivity type and electrical characteristics within each of the source/drain extension regions 110, 111 and the halo regions 112, 113. For example, the source/drain extension regions 110, 111 and the halo regions 112, 113 may each be formed at a sufficient dose such that the majority concentration of ions in each is of opposite conductivity type.

In some embodiments, the source/drain regions 114, 115 may be self-aligned to the spacers 109 (not shown). With reference now to FIG. 4, the source/drain regions 114, 115 may be of the same conductivity type as the dopants used to form the source/drain extension regions 110, 111 (e.g., n-type impurities for an NMOS device or p-type impurities for a PMOS device). The source/drain regions 114, 115 are formed overlying a portion of the source/drain extension regions 110, 111, spaced apart from the gate electrode structures 106. As shown in FIG. 4, in an embodiment, the source/drain regions 114 for the PFET device region 102 are formed by heavily doping p-type impurities, as indicated by arrows 157, and the source/drain regions 115 for the NFET device region 103 are formed by heavily doping n-type impurities, as indicated by the arrows 158.

Although not illustrated, the partially-formed integrated circuit is completed in a conventional manner by, for example, providing electrical contacts to the source and drain regions 114, 115 and to the gate electrodes 108. This conventional processing may include, for example, depositing interlayer dielectrics, etching contact vias, filling the contact vias with conductive plugs, and the like as are well known to those of skill in the art of fabricating integrated circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of the functional integrated circuit.

Figure 5:
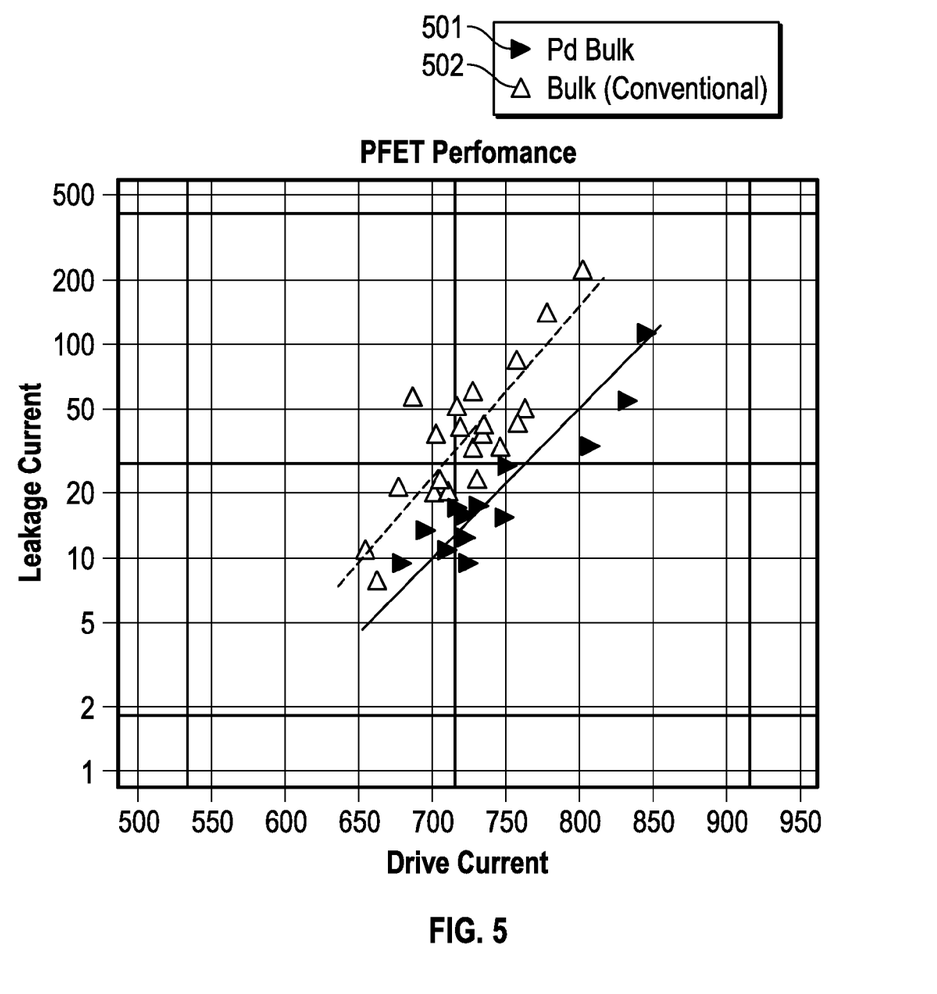
FIG. 5 is a graph illustrating simulated on/off current performance characteristics of bulk silicon integrated circuits structures fabricated in accordance with the methods illustrated in FIGS. 1-4.

FIG. 5 is a graph that illustrates a simulation of the electrical device behavior of the presently described integrated circuits (using "solid flag" symbology 501), as compared to conventionally-formed bulk silicon integrated circuits that do not include a partially-depleted region (using "open pyramid" symbology 502). As shown in FIG. 5, the performance of a simulated PFET increases by about 6% to about 10%. That is, the simulated PFET exhibits about 6% to about 10% higher drive current at the same leakage current, which is caused by the "kink effect" known previously from partially-depleted devices formed over SOI substrates in the prior art. In the simulated PFET, the kink effect occurs due to the storage of holes generated by ionization at the drain-body junction. As these carriers are collected in the body, they increase the body potential and lower the threshold voltage of the PFET leading to higher drive current compared to a conventional bulk device.

As such, various embodiments of bulk silicon integrated circuits and methods for fabricating the same have been disclosed including a "partially depleted" in a bulk substrate-based CMOS technology. This process flow enables transistors with higher performance due to the utilization of the kink effect on a relatively inexpensive and technologically-matured bulk technology. Further, this combination of classical bulk silicon substrates and partially-depleted transistors gives integrated circuit designers more flexibility for high-performance and low-power applications on the same circuit.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:

providing a bulk silicon substrate formed of a bulk silicon material that is lightly doped with a first dopant type so as to be a bulk silicon substrate of the first dopant type;

forming a first device region and a second device region on the bulk silicon substrate of the first dopant type;

forming a well region that is lightly doped with a second dopant type in the second device region so as to form a well region of the second dopant type within the bulk silicon substrate of the first dopant type in the second device region, wherein forming the well region of the second dopant type comprises implanting ions of the second dopant type into the bulk silicon material of the bulk silicon substrate;

forming a first gate electrode structure over the first device region so that the first gate electrode structure is in physical contact with the bulk silicon substrate of the first dopant type and a second gate electrode structure over the second device region and over the well region of the second dopant type so that the second gate electrode structure is in physical contact with the well region of the second dopant type;

forming heavily-doped source/drain extension regions of the first dopant type entirely in the bulk silicon substrate of the first dopant type adjacent to the first gate electrode structure, wherein forming the heavily-doped source/drain extension regions of the first dopant type comprises implanting ions of the first dopant type into the bulk silicon material of the bulk silicon substrate, and forming heavily-doped source/drain extension regions of the second dopant type entirely in the well region of the second dopant type adjacent to the second gate electrode structure, wherein forming the heavily-doped source/drain extension regions of the second dopant type comprises implanting ions of the second dopant type into the bulk silicon material of the well region of the bulk silicon substrate;

forming an intermediately-doped halo region of the second dopant type entirely in the bulk silicon substrate of the first dopant type underneath the first gate electrode structure, wherein forming the intermediately-doped halo region of the second dopant type comprises implanting ions of the second dopant type into the bulk silicon material of the bulk silicon substrate, and forming an intermediately-doped halo region of the first dopant type entirely in the well region of the second dopant type underneath the second gate electrode structure, wherein forming the intermediately-doped halo region of the first dopant type comprises implanting ions of the first dopant type into the bulk silicon material of the well region of the bulk silicon substrate; and forming heavily-doped source/drain regions of the first dopant type entirely in the bulk silicon substrate of the first dopant type overlying a portion of the source/drain extension regions in the first device region, wherein forming the heavily-doped source/drain regions of the first dopant type comprises implanting ions of the first dopant type into the bulk silicon material of the bulk silicon substrate, and forming heavily-doped source/drain regions of the second dopant type entirely in the well region of the second dopant type overlying a portion of the source/drain extension regions in the second device region, wherein forming the heavily-doped source/drain regions of the second dopant type comprises implanting ions of the second dopant type into the bulk silicon material of the well region of the bulk silicon substrate.

2. The method of claim 1, wherein providing the bulk silicon substrate that is lightly doped with the first dopant type comprises providing a bulk silicon substrate comprising a p-type dopant.

3. The method of claim 1, wherein forming the well region that is lightly doped with the second dopant type comprises forming a well region comprising an n-type dopant.

4. The method of claim 1, wherein forming the first device region and the second device region in the bulk silicon substrate comprises forming a shallow trench isolation structure in the bulk silicon substrate.

5. The method of claim 1, wherein forming the first gate electrode structure comprises forming a gate insulation layer.

6. The method of claim 5, wherein forming the first gate electrode structure comprises forming a gate electrode layer.

7. The method of claim 6, wherein forming the first gate electrode structure comprises forming spacer structures.

8. The method of claim 1, wherein forming the well region that is lightly doped comprises forming a well region that is doped to a dopant concentration of less than about $5E13/cm^3$.

9. The method of claim 1, wherein forming the intermediately-doped halo region comprises forming a halo region that is doped to a dopant concentration from about 5E13 to about $5E15/cm^3$.

10. The method of claim 1, wherein forming the heavily-doped source/drain regions comprises forming source/drain regions that are doped to a dopant concentration of greater than about $5E15/cm^3$.

* * * * *